United States Patent
Coronel et al.

(10) Patent No.: US 7,141,837 B2
(45) Date of Patent: Nov. 28, 2006

(54) HIGH-DENSITY MOS TRANSISTOR

(75) Inventors: Philippe Coronel, Barraux (FR); Yves Morand, Grenoble (FR); Thomas Skotnicki, Crolles-Montfort (FR); Robin Cerutti, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 120 days.

(21) Appl. No.: 10/817,147

(22) Filed: Apr. 2, 2004

(65) Prior Publication Data
US 2004/0262690 A1 Dec. 30, 2004

(30) Foreign Application Priority Data
Apr. 3, 2003 (FR) .................................. 03 04143

(51) Int. Cl.
*H01L 27/148* (2006.01)
*H01L 29/80* (2006.01)
(52) U.S. Cl. ...................... 257/241; 257/287
(58) Field of Classification Search ................ 257/224
See application file for complete search history.

(56) References Cited

U.S. PATENT DOCUMENTS

| 5,965,914 A | 10/1999 | Miyamoto ................. 257/331 |
| 6,207,530 B1 | 3/2001 | Hsu et al. ................... 438/404 |
| 6,396,108 B1 * | 5/2002 | Krivokapic et al. ........ 257/365 |
| 6,495,403 B1 | 12/2002 | Skotnicki et al. ........... 438/157 |
| 2001/0053569 A1 | 12/2001 | Skotnicki et al. ........... 438/142 |

FOREIGN PATENT DOCUMENTS

| DE | 199 28 564 A1 | 1/2001 |
| DE | 101 19 411 A1 | 11/2001 |
| EP | 0 612 103 B1 | 8/1994 |

\* cited by examiner

*Primary Examiner*—Zandra V. Smith
*Assistant Examiner*—Kiesha Rose
(74) *Attorney, Agent, or Firm*—Lisa K. Jorgenson; Hai Han; Seed IP Law Group PLLC

(57) ABSTRACT

A MOS transistor formed in a silicon substrate comprising an active area surrounded with an insulating wall, a first conductive strip covering a central strip of the active area, one or several second conductive strips placed in the active area right above the first strip, and conductive regions placed in two recesses of the insulating wall and placed against the ends of the first and second strips, the silicon surfaces opposite to the conductive strips and regions being covered with an insulator forming a gate oxide.

19 Claims, 5 Drawing Sheets

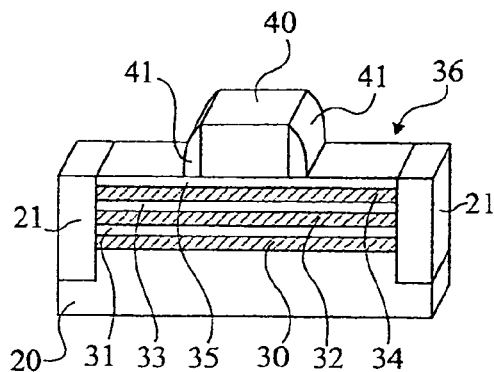 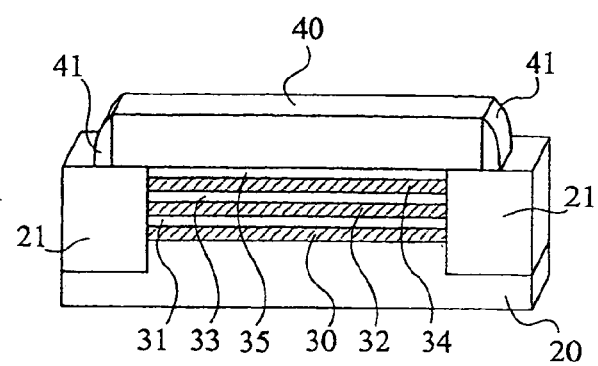
Fig 4A Fig 4B
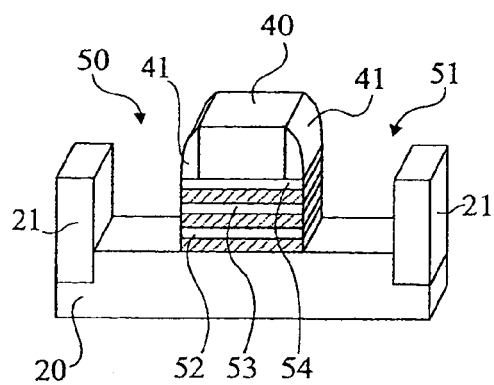 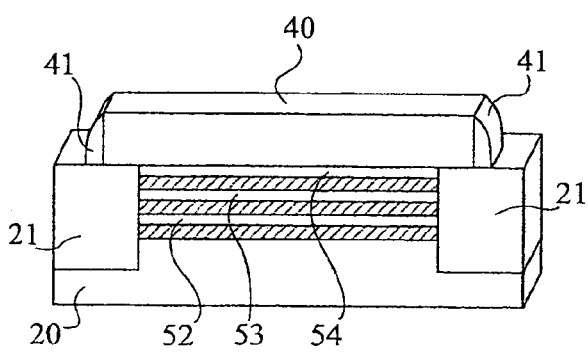
Fig 5A Fig 5B
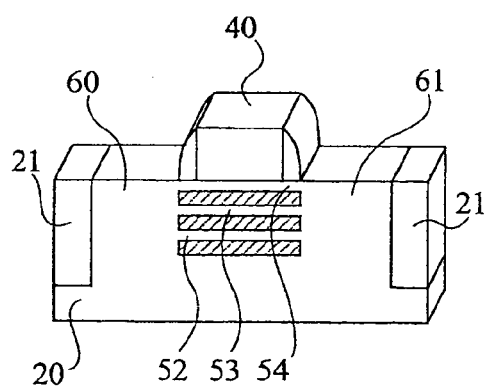 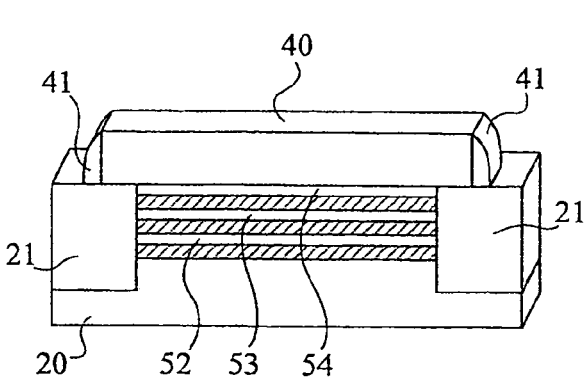
Fig 6A Fig 6B

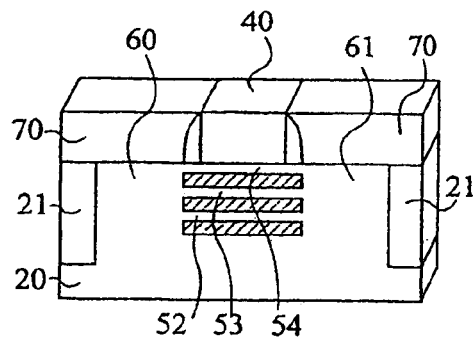
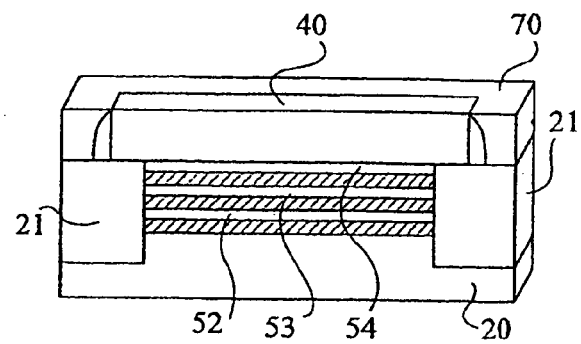
Fig 7A                Fig 7B
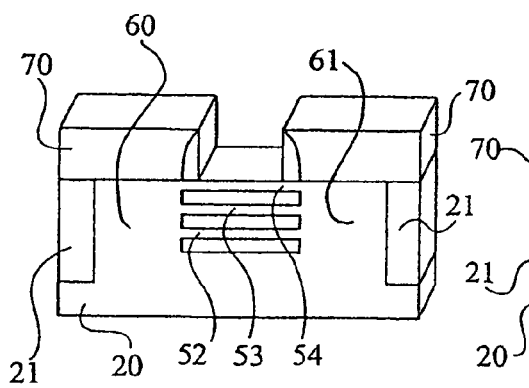
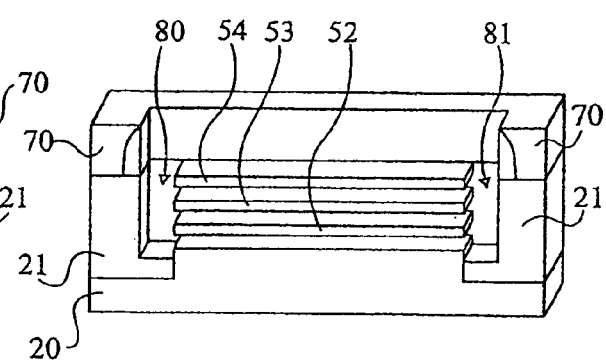
Fig 8A                Fig 8B
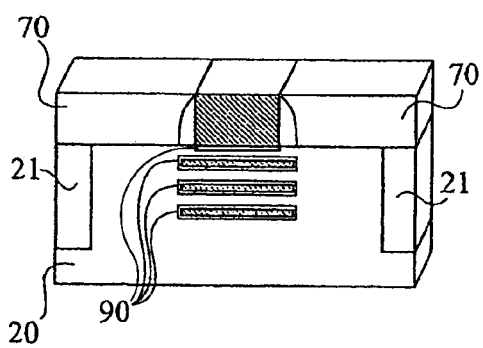
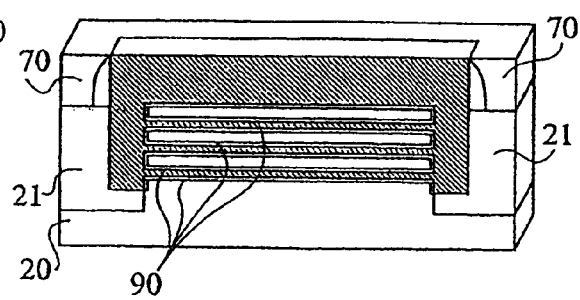
Fig 9A                Fig 9B

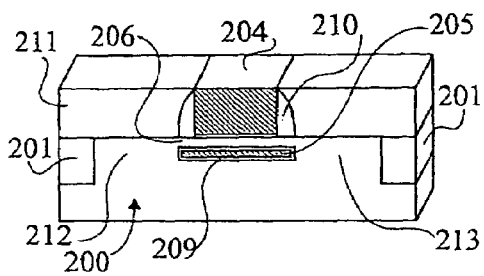
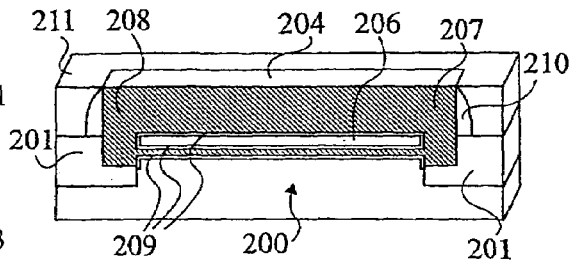
Fig 11A        Fig 11B
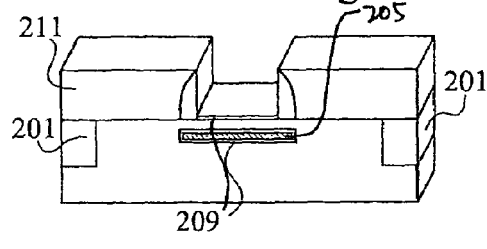
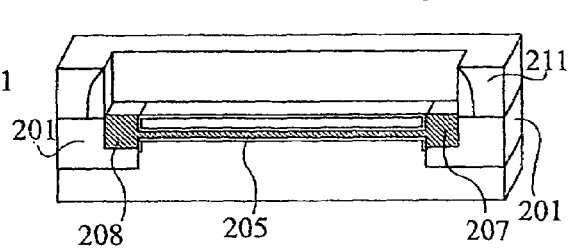
Fig 12A        Fig 12B
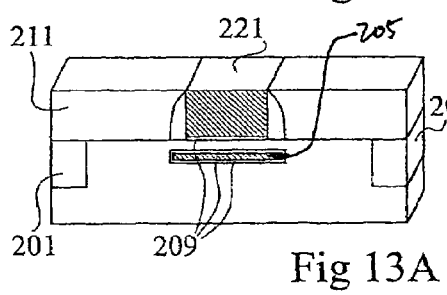
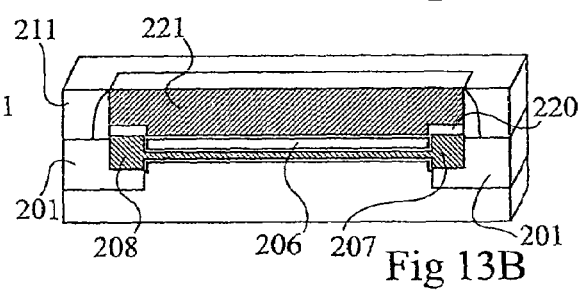
Fig 13A        Fig 13B
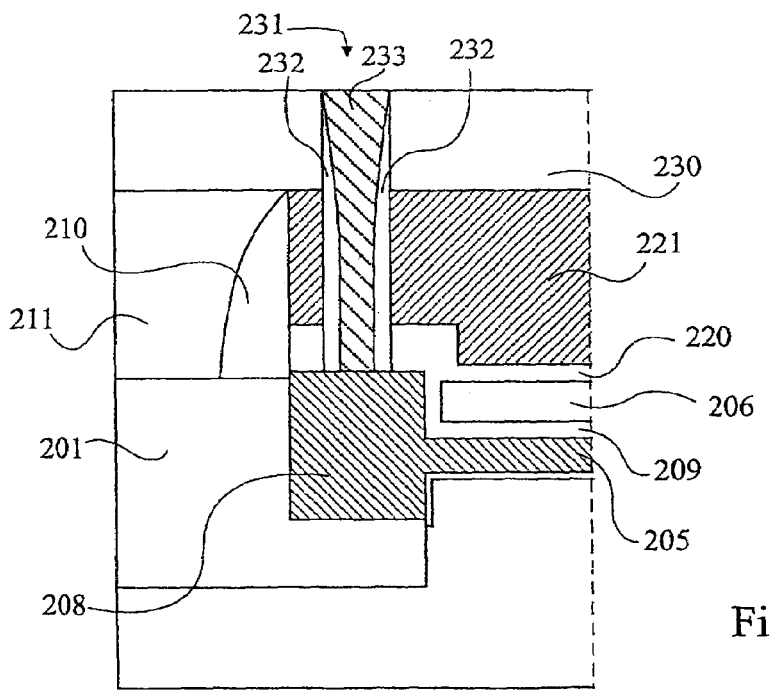
Fig 14

HIGH-DENSITY MOS TRANSISTOR

BACKGROUND OF THE INVENTION

1. Field of the Invention

The present invention relates to MOS transistors. More specifically, the present invention relates to transistors with thin channels such as gate-all-around transistors

2. Description of the Related Art

FIG. 1 is a known diagram of a gate-all-around transistor. The transistor is formed on a semiconductor substrate 1. An area 2 of substrate 1 is surrounded with an insulating wall 3 formed of a shallow trench filled with an insulator (STI). A single-crystal silicon bridge 4 runs above area 2 and bears against insulating wall 3 on each side of area 2. Bridge 4 is narrower than area 2 so that in top view, area 2 can be seen, on either side of bridge 4. The interval between bridge 4 and area 2 is taken up by a polysilicon portion 5. A polysilicon strip 6 runs above bridge 4 and covers part of area 2 on either side of bridge 4. Portion 5 and strip 6 are in contact and form the transistor gate. The transistor gate is separated from silicon bridge 4 and from area 2 by gate oxide 7. The portions of single-crystal bridge 4 not covered with strip 6 are doped of a first conductivity type and form the transistor source and drain areas, and the covered bridge portion is doped of a second conductivity type and forms the transistor channel.

Such a gate-all-around transistor enables avoiding certain problems intrinsic to small-size conventional transistors, such as the "short channel" effect.

However, for a given channel length, the forming of a gate-all-around transistor of same channel width as a conventional transistor requires increasing the total surface area of the transistor, which goes against the desired evolution.

Moreover, the forming of such a gate-all-around transistors requires an additional manufacturing mask with respect to the forming of a conventional transistor, the additional mask being used, among others, to etch a silicon layer to form bridge 4.

BRIEF SUMMARY OF THE INVENTION

An embodiment of the present invention provides a gate-all-around MOS transistor comprising one or several thin channels.

Another embodiment of the present invention provides such a transistor taking up a surface area identical to that taken up by a conventional transistor of same channel length and width.

Another embodiment of the present invention provides a method for manufacturing such a transistor which does not require additional manufacturing masks with respect to a conventional MOS transistor manufacturing method.

In particular, the present invention provides a MOS transistor formed in a silicon substrate comprising an active area surrounded with an insulating wall; a first conductive strip covering a central strip of the active area; one or several second conductive strips placed in the active area right above the first strip; and conductive regions placed in two recesses of the insulating wall and placed against the ends of the first and second strips; the silicon surfaces opposite to the conductive strips and regions being covered with an insulator forming a gate oxide.

According to an alternative embodiment of the above-described transistor, the first and second conductive strips are made of polysilicon and the insulating wall is made of silicon oxide.

According to an alternative embodiment of the above-described transistor, the transistor comprises two conductive strips and the conductive regions placed against the first and second strips are separate.

The present invention also provides a method for forming a MOS transistor comprising the steps of: forming at the periphery of an active area of a silicon substrate an insulating wall protruding from the substrate surface; forming in the active area a stack of layer pairs, each pair comprising a layer of a material selectively etchable with respect to silicon and a single-crystal silicon layer; forming a strip of a material selectively etchable with respect to silicon above the stack and the insulating walls, the strip substantially extending above a central strip of the active area; anisotropically etching the stack on either side of the strip; growing silicon by epitaxy; forming a protection layer of a material different from that of the strip, of the insulating walls, and of the stack; disengaging and removing said strip; etching the insulating walls unprotected by said protection layer at least down to the level of the bottom of the stack; removing the stack layers made of a material selectively etchable with respect to silicon; forming a thin silicon oxide layer at the surface of the silicon areas; and filling with a conductive material.

According to an alternative embodiment of the above-described method, the method comprises between the step of growing silicon by epitaxy and the step of forming a protection layer a step of doping the silicon on either side of the remaining portion of the stack.

According to an alternative embodiment of the above-described method, the method comprises, prior to the step of growing silicon by epitaxy, a step of doping the ends of the remaining portions of the silicon layers of the stack.

According to an alternative embodiment of the above-described method, the method comprises prior to the step of forming a protection layer a silicide-forming step.

According to an alternative embodiment of the above-described method, the method further comprises the steps of: etching said conductive material to expose a silicon oxide portion covering the upper part of the active area; removing said silicon oxide portion; forming an insulating layer above said conductive material and the upper part of the active area; filling with a second conductive material.

The foregoing features, and advantages of the present invention will be discussed in detail in the following non-limiting description of specific embodiments in connection with the accompanying drawings.

BRIEF DESCRIPTION OF THE DRAWINGS

FIGS. 2 to 9 are perspective and cross-section views of the structures obtained after different steps of the MOS transistor manufacturing method according to the present invention, FIGS. 4A, 5A, 6A, 7A, 8A, and 9A being cross-section views along a first axis and FIGS. 4B, 5B, 6B, 7B, 8B, and 9B being cross-sections views along a second axis perpendicular to the first one;

FIGS. 11 to 13 are perspective and cross-section views of structures obtained according to an alternative of the method of the present invention, FIGS. 11A, 12A and 13A being cross-section views along the first axis and FIGS. 11B, 12B, and 13B being cross-section views along a second axis perpendicular to the first one; and FIG. 14 is a cross-section view of the structure obtained at a subsequent step of the above-mentioned alternative method.

DETAILED DESCRIPTION OF THE INVENTION

As current in the representation of integrated circuit components, the various drawings are not to scale.

The present invention provides a MOS transistor comprising one or several channels that can be controlled by a same gate or possibly by two independent gates. The present invention provides a method for forming such MOS transistors.

Figure 1:
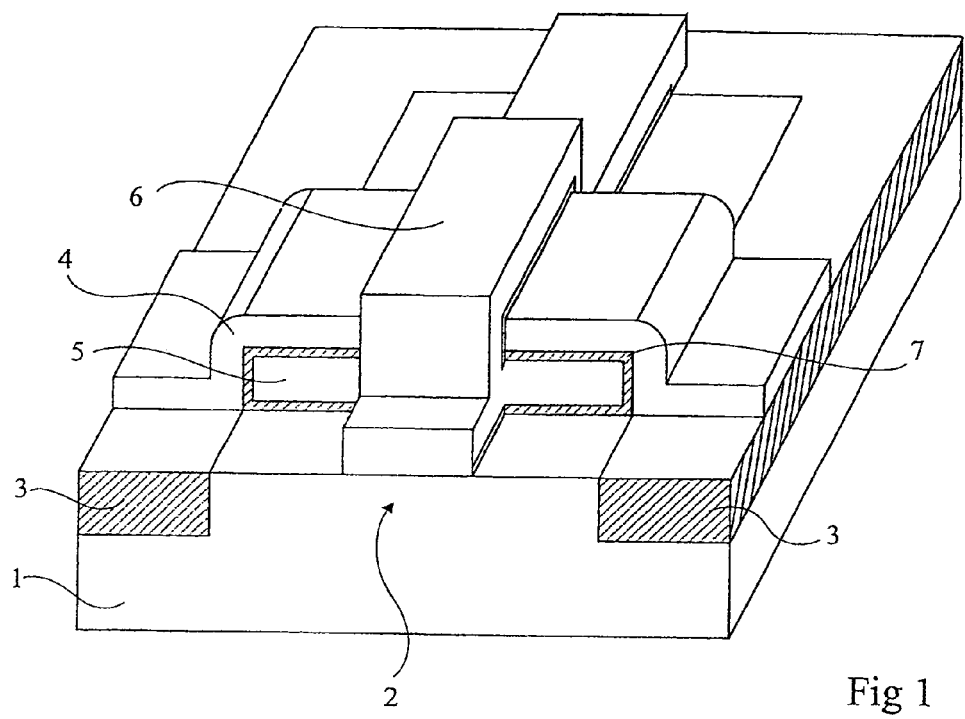
FIG. 1 is a perspective view, previously described, of a gate-all-around transistor according to prior art.
Figure 2:
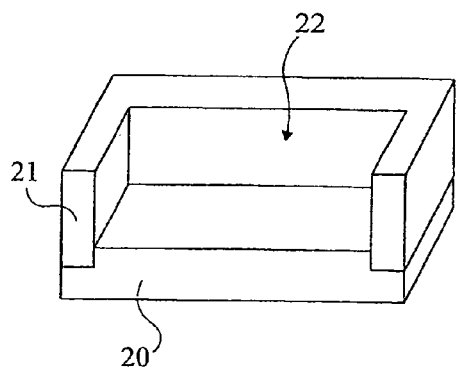

In a first step of the method of one embodiment of the present invention, illustrated in FIG. 2, an insulating wall 21 surrounding a substantially parallelepiped-shaped active area on a substrate 20 is formed. Insulating wall 21 conventionally is made of silicon oxide and substrate 20 may be a silicon layer. The active area is then etched to obtain an opening 22 having its bottom located between the lower and upper surfaces of insulating wall 21.

Generally, any method of forming around an active area of a substrate an insulating wall protruding from the substrate surface may be used.

Figure 3:
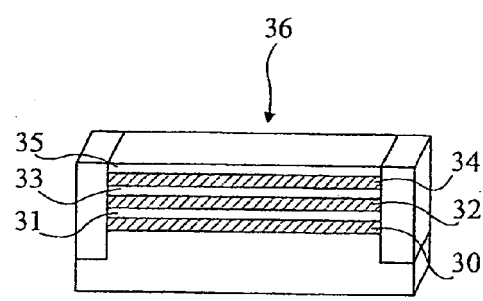

At a next step, illustrated in FIG. 3, a first silicon/germanium layer 30 is grown by epitaxy in opening 22. A single-crystal silicon layer 31 is then grown by epitaxy above silicon/germanium layer 30. In the example of FIG. 3, two other pairs of layers, each layer pair being formed of a silicon/germanium layer, respectively 32 and 34, and of a silicon layer, respectively 33 and 35, are grown by epitaxy. The three layer pairs form a stack 36.

Generally, the first layer of each pair in the stack may be formed of any material selectively etchable with respect to the single-crystal silicon. The stack may be formed in several ways. The forming of the silicon layers may for example comprise a silicon deposition and a high-temperature crystallization.

To ensure a proper implementation of the silicon/germanium etch step described hereafter, it is desirable for the thickness of stack 36 to be equal to or smaller than the depth of opening 22. Indeed, in the case where stack 36 sticks out of opening 22, the edges of the last silicon/germanium layers are covered with the upper silicon layers, which hinders the etching of the silicon/germanium layers performed in one of the last steps of the method. However, the thickness of stack 36 may be much smaller than the depth of opening 22. However, for simplification of the next method steps, the depth of opening 22 will be provided so that the upper surface of stack 36 is at the level of the upper surface of insulating wall 21.

At the end of the method of the present invention, the remaining portions of the single-crystal silicon layers of stack 36 will form channel areas. The channel of a transistor being conventionally slightly doped, an in-situ doping will be performed upon epitaxial growth of single-crystal silicon layers 31, 33, and 35 of stack 36.

At a next step, illustrated in FIGS. 4A and 4B, a sacrificial strip 40, for example, made of polysilicon, is formed above previously-formed stack 36 and insulating wall 21. Sacrificial strip 40 is substantially parallel to two opposite edges of opening 22 and is placed between its two edges. Strip 40 has a width smaller than the distance between the two above-mentioned edges so that stack 36 is visible in top view on either side of sacrificial strip 40.

FIG. 4A is a cross-section view made along an axis perpendicular to strip 40 cutting stack 36 and FIG. 4B is a cross-section view made along the axis of strip 40 substantially in the middle of this strip. FIGS. 5A, 6A, 7A, 8A, and 9A are cross-section views along the same axis as that in FIG. 4A and FIGS. 5B, 6B, 7B, 8B, and 9B are cross-section views along the same axis as that in FIG. 4B.

In a next optional step of the method of the present invention, spacers 41 are formed on the sides of sacrificial strip 40. Spacers 41 are for example formed of silicon nitride ($Si_3N_4$). An embodiment of spacers 41 consists of performing a conformal nitride deposition and of then performing an anisotropic etch to keep nitride on the sides of the protruding elements.

At a next step, illustrated in FIGS. 5A and 5B, stack 36 is anisotropically etched on either side of strip 40 and of spacers 41. The etching of layers 30 to 35 of stack 36 may be performed with one or several etches. Two openings 50 and 51 are thus obtained on either side of the remaining portion of stack 36.

At a next optional step, an ion implantation is performed to dope the ends of channels 52, 53 and 54 respectively corresponding to the remaining portions of single-crystal silicon layers 31, 33, and 35. The doping thus carried out is intended to form heavily-doped extensions of the sources and drains of a different type than that used to dope channels 52, 53, and 54.

At a next step, illustrated in FIGS. 6A and 6B, single-crystal silicon areas are grown by epitaxy in openings 50 and 51 from substrate 20 and the sides of the layers of stack 36. The epitaxy is carried on until openings 50 and 51 are totally filled to the level of the upper surface of channel 54.

At a next step, single-crystal silicon areas 60 and 61 located on both sides of stack 36 are doped to form source and drain areas. The type of doping used for the source and drain is identical to that used to dope the ends of channels 52, 53, and 54.

At a next optional step, a silicide layer may be formed on single-crystal silicon areas 60 and 61. This silicide layer improves the conductivity of drain and source areas 60 and 61. Further, it eases the forming of contacts enabling connection of the source and drain areas to the integrated circuit interconnect network.

At a next step illustrated in FIGS. 7A and 7B, the previously-obtained structure is covered with a protection layer 70. Then, by etching, by chem.-mech polishing or by any other method, the thickness of protection layer 70 is reduced to expose sacrificial strip 40. Protection layer 70 may be made of any material different from the material used to form sacrificial strip 40. Further, protection layer 70 must be able to resist against etchings of the insulating wall and of the silicon/germanium layers formed in the subsequent method steps. Protection layer 70 is for example a silicon nitride layer.

At a next step, illustrated in FIGS. 8A and 8B, sacrificial strip 40 is removed, for example by etching.

Insulating wall 21 is then etched above the wall areas uncovered with protection layer 70 selectively with respect to the silicon of the stack to form two recesses 80 and 81 open on the ends of stack 36.

The remaining portions of silicon/germanium layers 30, 32, and 34 are then removed by etching. At the end of this silicon/germanium removal, single-crystal silicon channels 52, 53, and 54 form three superposed bridges in continuity on one side and the other with source and drain areas 60 and 61, as can be seen in FIG. 8A.

At a next step, illustrated in FIGS. 9A and 9B, a thermal oxidation is carried out to oxidize the exposed silicon surfaces altogether to form a thin silicon oxide layer 90. Silicon oxide thus forms on each side of channels 52, 53, and 54, on the surface of substrate 20 located straight above channels 52 and 54 and on the exposed regions of source and drain areas 60 and 61 between the substrate and each of channels 52 to 54.

A conductive material is then conformally deposited to fill the "tunnels" located between the substrate and channels 52, 53, and 54, as well as recesses 80 and 81 and the opening delimited by protection layer 70 corresponding to the space previously taken up by sacrificial strip 40. The conductive material for example is polysilicon or a metal such as aluminum. The gate of the transistor surrounding the three channels 52, 53, and 54 has thus been formed.

Like the manufacturing method of a conventional MOS transistor, the method of the present invention requires two masks: a mask of definition of the active area and a "gate" definition mask used to form sacrificial strip 40.

An advantage of the method of the present invention is that it requires no additional mask with respect to a conventional method.

Further, the two masks necessary for a "conventional" method and for the method of the present invention are identical.

Another advantage of the method of the present invention thus is that, from a same set of masks, conventional transistors or transistors according to the present invention may be formed.

Figure 10:
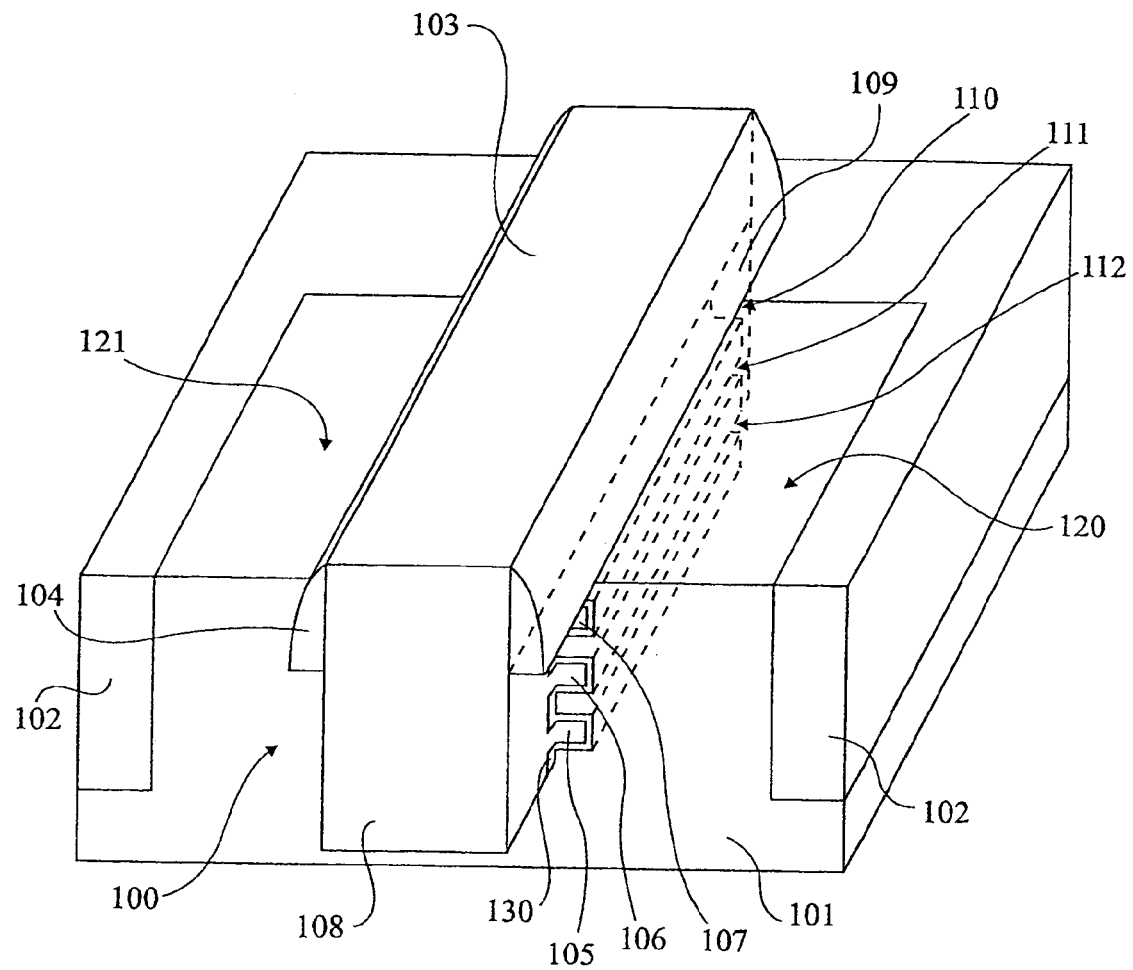
FIG. 10 is a perspective view of a MOS transistor according to the present invention.

FIG. 10 is a perspective view of one embodiment of a MOS transistor according to the present invention that can be obtained according to the previously-described method. The transistor is formed in an active area 100 of a semiconductor substrate 101, typically made of silicon. Active area 100 is in this example substantially parallelepiped-shaped and is surrounded with an insulating wall 102, for example made of silicon oxide (HDP). A conductive strip 103 is placed above active area 100. The strip is substantially parallel to two opposite edges of active area 100 and has a width smaller than the distance between the two edges so that active area 100 is visible in top view on either side of strip 103. Spacers 104, for example, made of nitride, are placed against the sides of strip 103. Three conductive strips 105, 106, and 107 are placed in active area 100 below conductive strip 103. Strips 103, 105, 106, and 107 are separated from one another by single-crystal silicon strips 110, 111, and 112. Silicon strips 110 to 112 form three channels of the transistor between source and drain areas 120 and 121 formed by the two portions of active area 100 located on either side of the assembly of strips 103, 105 to 107, 110 to 112. Source and drain areas 120 and 121 are of a doping type opposite to that of channel strips 110, 111, and 112. Two conductive regions 108 and 109 are placed against the ends of conductive strips 103, 105, 106, and 107 and of silicon strips 110, 111, and 112. Conductive regions 108 and 109, are placed in two recesses of insulating wall 102 formed in prolongation of strips 103, 105 to 107, 110 to 112. Conductive strip 103, conductive regions 108 and 109, and conductive strips 105, 106 and 107 form the MOS transistor gate that is for example made of polysilicon. The assembly of the silicon areas of the active area facing the gate is covered with a thin silicon oxide layer (130) forming the gate oxide. Thus, conductive strips 103, 105, 106, and 107 are insulated from silicon strips 110, 111, and 112 by a thin silicon oxide layer. Similarly, the two conductive regions 108 and 109 are insulated from the substrate and from silicon strips 110 to 112 by silicon oxide. Conductive strips 105, 106, and 107 are insulated from source and drain areas 120 and 121 and from substrate 101 by silicon oxide.

The above-described MOS transistor comprises three channels. Generally, a transistor according to the present invention may comprise one or several channels separated from one another by a conductive strip.

As compared to a conventional transistor of same channel length and width, the transistor as shown in FIG. 10 exhibits in conduction mode a greater current (Ion) due to the presence of several channels in "parallel".

Further, the structure of the transistor of the present invention is such that it is possible to have thin channels, which avoids many problems linked to small-size transistors.

As a non-limiting example, the dimensions of the different elements of the MOS transistor of the present invention are the following:

channel thickness (strips 110, 111, and 112): from 5 to 20 nm, thickness of the gate conductive strips (strips 105, 106, and 107): from 20 to 80 nm, thickness of the thin silicon oxide layer: from 1 to 2 nm, transistor length (equal to the width of conductive strips 105, 106, and 107): from 25 to 0.50 nm.

FIGS. 11 to 14 are cross-section views of the structures obtained after steps of an alternative method of the present invention by forming a transistor having its all-around gate formed in two independent portions. In the example of FIGS. 11 to 14, a transistor with two gates placed under and above a single channel area is formed. The formation of such a transistor consists of all the steps of the method of the present invention previously described in relation with FIGS. 2 to 9, with the formation of a single pair of silicon-germanium/silicon layers at the step described in relation with FIG. 3.

FIGS. 11A, 12A, 13A are cross-section views along the same axis as in FIG. 4A, and FIGS. 11B, 12B, and 13B are cross-section views along the same axis as in FIG. 4B.

FIGS. 11A and 11B show an all-around gate transistor such as that in FIGS. 9A and 9B, but comprises a single channel. The transistor is formed at the surface of a substrate in an active area 200 surrounded with an insulating wall 201. A first conductive strip 204 extends substantially above a central strip of active area 200. A second conductive strip 205 is placed in active area 200 below first strip 204. The two strips are separated by a single-crystal silicon channel area 206. Two conductive regions 207 and 208 are placed against the ends of the first and second strips 204 and 205. The two conductive regions 207 and 208 are placed in two recesses formed in insulating wall 201. Silicon oxide 209 covers the silicon surfaces facing conductive strips 204 and 205 and conductive regions 207 and 208. As in the structure illustrated in FIGS. 9A and 9B, conductive strips 204 and 205 and conductive regions 207 and 208 are for example made of polysilicon. Spacers 210 are placed on the sides of strips 204 and conductive regions 206 and 207 above the insulating wall. A protection layer 211 covers the entire structure except for the conductive strip 204. Channel area 206 is connected to source and drain areas 212 and 213. Channel area 206 and source and drain areas 212 and 213 have different types of doping.

In a first step of the alternative method of the present invention, illustrated in FIGS. 12A and 12B, conductive strip 204 is etched integrally to expose the silicon oxide 209 covering channel area 206, to leave in place the lower parts of conductive regions 207 and 208 in contact with the opposite ends of conductive strip 205.

In a next step, illustrated in FIGS. 13A and 13B, the portion of silicon oxide 209 located above channel area 206 is removed to expose the channel. Then, channel area 206 and the polysilicon of conductive regions 207 and 208 are oxidized to form a silicon oxide layer 220. Preferably, the oxidation method is such that the polysilicon oxidizes faster than the single-crystal silicon so that a thin gate oxide layer forms on channel area 206 and a thicker silicon oxide layer forms on conductive regions 207 and 208. A filling with a conductive material such as polysilicon or aluminum is then performed to form a conductive strip 221 above silicon oxide layer 220.

Conductive strip 205 and the remaining portions of conductive regions 207 and 208 form a "lower" gate. Conductive strip 221 forms an "upper" gate. The upper gate is easily accessible through a contact formed above the gate. For some applications, such as the forming of a memory point, the lower gate may be left floating. In the opposite case where the lower gate is desired to be controlled, a connection is formed between the lower gate and a conductive area connectable to the integrated circuit interconnect network.

The forming of such a connection enabling access to the lower gate may for example be carried out according to the following method. As appears from FIG. 14, which is an enlargement of the left-hand portion of the cross-section view of FIG. 13B, the structure is covered with an insulating layer 230, for example, TEOS. Insulating layer 230, upper gate 221, and silicon oxide layer 220 are then successively etched to form an opening 231 above the remaining portion of conductive region 208 belonging to the lower gate. Spacers 232, for example, made of nitride, are then formed on the walls of opening 231. Spacers 232 may be formed according to a method consisting of performing a conformal nitride deposition and of anisotropically etching the nitride to expose the lower gate. Opening 231 is then filled with a conductive material 233 such as aluminum. The connection thus formed may be connected to the integrated circuit interconnect network via a contact formed above the connection.

Of course, the present invention is likely to have various alterations, modifications, and improvements which will readily occur to those skilled in the art. In particular, the conductive materials used to form the gates of a transistor with two gates may be different. Further, the thickness and the nature of the insulating layer separating the channel from the lower gate may be different from those of the insulating layer separating the channel from the "upper" gate.

Moreover, those skilled in the art may recognize that other types of connections may be provided between the lower gate of a transistor with two gates and the integrated circuit interconnect network conventionally formed above the transistor.

Further, those skilled in the art may provide removing the protection layer at the end of the method of the present invention or of the alternative method of the present invention described hereabove. In the case where the protection layer is removed, it may be provided to implant the source and drain areas at the very end of the method, and not after the epitaxial growth of the source and drain areas.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A MOS transistor formed in a single-crystal silicon substrate comprising:
   an insulating wall surrounding an upper portion of the single-crystal silicon substrate;
   a first conductive strip above a central strip of the upper portion;
   a second conductive strip in the upper portion right below the first conductive strip; and
   conductive regions placed in two recesses of the insulating wall and placed against ends of the first and second conductive strips, wherein, the first conductive strip, the second conductive strip and the conductive regions form a gate, and silicon surfaces of the single-crystal substrate abutting the gate are covered with a gate oxide.

2. The transistor of claim 1 wherein the first and second conductive strips are made of polysilicon and the insulating wall is made of silicon oxide.

3. The transistor of claim 1 wherein, the first conductive strip and the second conductive strip are parallel to each other and are defined by a first end and a second end along a length thereof, a first conductive region is in contact with the first end, and a second conductive region is in contact with the second end.

4. The MOS transistor of claim 1 wherein the second conductive strip is one of a plurality of second conductive strips, said second conductive strips together with said first conductive strips forming a stack.

5. The MOS transistor of claim 4 wherein the number of second conductive strips is 1, 2 or 3.

6. The MOS transistor of claim 5 wherein each said conductive strip of said stack is separated from one another by a single-crystal silicon layer.

7. A MOS transistor formed in a single-crystal silicon substrate comprising:
   an active area in the single-crystal silicon substrate surrounded by an insulating wall;
   first conductive strip covering a central strip of the active area and forming first gate;
   a first insulating layer immediately below said first conductive strip;
   a second conductive strip placed in the active area below said first insulating layer and separated therefrom by a single-crystal silicon layer that is a part of the single-crystal silicon substrate; and
   conductive regions below first insulating layer, said conductive regions being placed in two recesses of the insulating wall and against ends of the second conductive strips and said single-crystal silicon layer, said conductive regions and said second conductive strip forming second gate, wherein, silicon surfaces of said active area abutting said second conductive strip and conductive regions are covered with a second insulating layer.

8. The MOS transistor of claim 6 wherein said first conductive strip is made of polysilicon.

9. The MOS transistor of claim 6 wherein said first conductive strip is made of aluminum.

10. The MOS transistor of claim 6 wherein said second conductive strip and said conductive regions are made of polysilicon.

11. The MOS transistor of claim 6 wherein said first and second insulating layers are silicon oxide.

12. The MOS transistor of claim 7 wherein the second conductive strip is one of a plurality of second conductive strips, said second conductive strips together with said first conductive strips forming a stack.

13. The MOS transistor of claim 12 wherein the number of the plurality of second conductive strips is 2 or 3.

14. The MOS transistor of claim 5 wherein each said conductive strip of said stack is separated from one another by a single-crystal silicon layer.

15. A MOS transistor comprising:
- a single-crystal silicon substrate having an active area surrounded by insulating walls protruding from a surface of the substrate;
- a stack of a plurality of layer pairs formed in the active area, each layer pair including a conductive layer and a single-crystal silicon layer, the conductive layers alternating with the single-crystal silicon layers, the single-crystal silicon layers being parts of the single-crystal silicon substrate;
- an insulating layer overlying the stack;
- a first gate overlying the insulating layer; and
- a second gate comprising a first conductive region, a second conductive region and the plurality of the conductive layers of the stack, said first and second conductive regions abutting two opposing sides of the stack respectively.

16. The MOS transistor of claim 15 wherein the stack comprising three layer pairs of alternating conductive layers and single crystal silicon layers.

17. The MOS transistor of claim 15 wherein the first gate is a polysilicon layer.

18. The MOS transistor of claim 15 wherein the first gate is an aluminum layer.

19. The MOS transistor of claim 15 wherein the second gate is made of polysilicon.

* * * * *